United States Patent
Park et al.

(10) Patent No.: US 8,908,456 B2
(45) Date of Patent: Dec. 9, 2014

(54) SEMICONDUCTOR MEMORY DEVICE AND OPERATING METHOD THEREOF

(75) Inventors: Kyoung Hwan Park, Seoul (KR); Seung Won Kim, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 277 days.

(21) Appl. No.: 13/602,021

(22) Filed: Aug. 31, 2012

(65) Prior Publication Data

US 2013/0064029 A1     Mar. 14, 2013

(30) Foreign Application Priority Data

Sep. 8, 2011    (KR) .......................... 10-2011-0091043

(51) Int. Cl.
    *G11C 7/00*     (2006.01)
    *G11C 7/12*     (2006.01)

(52) U.S. Cl.
    CPC ........................................ *G11C 7/12* (2013.01)
    USPC .................. 365/203; 365/195; 365/185.18

(58) Field of Classification Search
    CPC ......... G11C 16/0483; G11C 7/12; G11C 8/08
    USPC ...................... 365/203, 195, 185.18
    See application file for complete search history.

(56) References Cited

U.S. PATENT DOCUMENTS 8,634,251 B2 * 1/2014 Chung ..................... 365/185.25

* cited by examiner

*Primary Examiner* — Son Dinh
*Assistant Examiner* — Nam Nguyen
(74) *Attorney, Agent, or Firm* — William Park & Associates Patent Ltd.

(57) ABSTRACT

An operating method of a semiconductor memory device includes precharging a channel region of a program-inhibited cell of first memory cells coupled to a first word line, selected from a first one of word line groups between a drain select line and a source select line, to a first level based on first data; performing a first program operation for storing the first data in the first memory cells; precharging the channel region of a program-inhibited cell of second memory cells coupled to a second word line, selected from a second one of the word line groups, to a second level based on second data to be stored in the second memory cells; and performing a second program operation for storing the second data in the second memory cells.

20 Claims, 12 Drawing Sheets

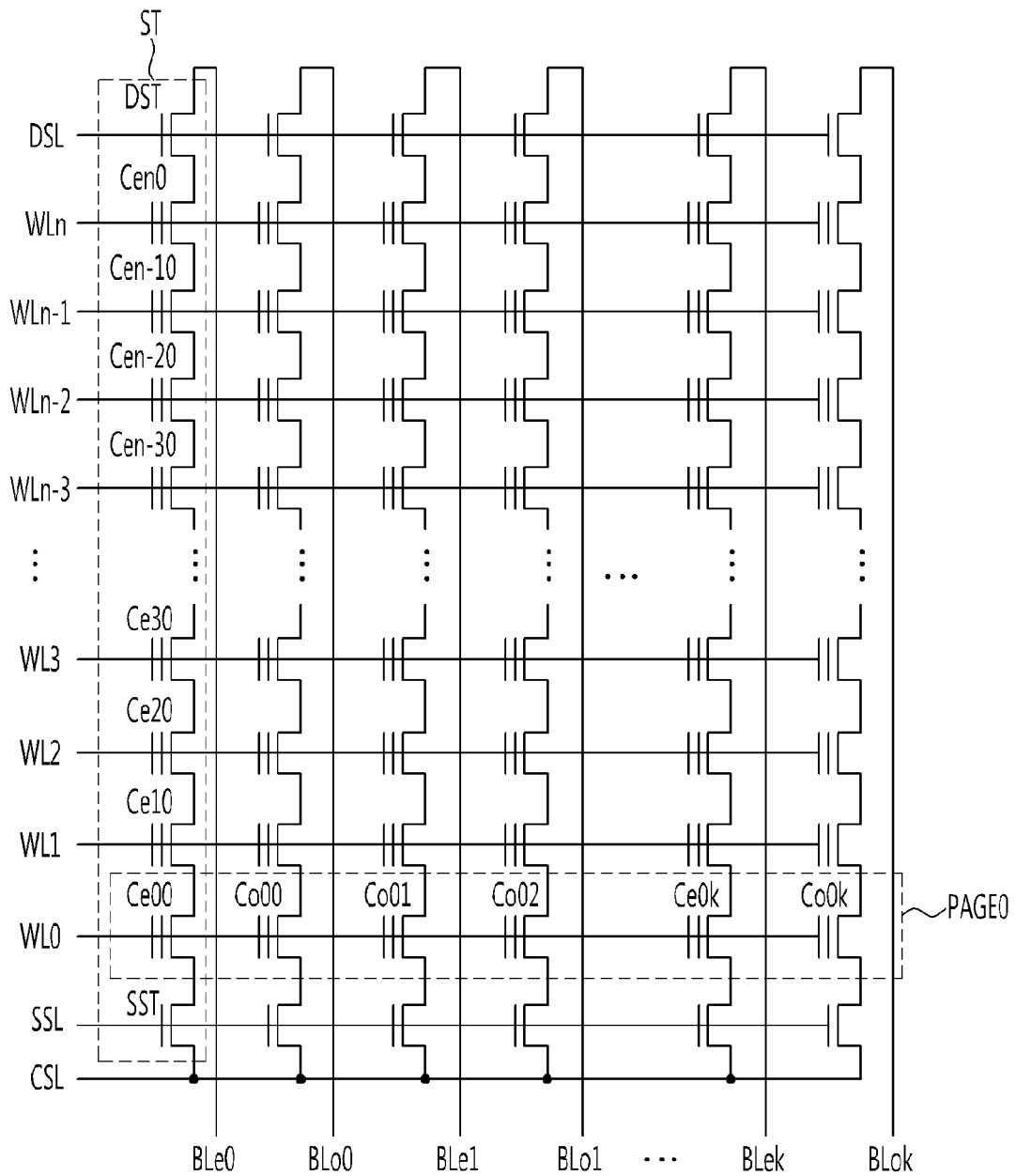

SEMICONDUCTOR MEMORY DEVICE AND OPERATING METHOD THEREOF

CROSS-REFERENCE TO RELATED APPLICATION

The present application claims priority to 35 U.S.C. 119(a) Korean patent application number 10-2011-0091043 filed on Sep. 8, 2011 in the Korean intellectual property office, the entire disclosure of which is incorporated by reference herein.

BACKGROUND

1. Field of the Invention

Example embodiments relate to a semiconductor memory device and an operating method thereof and, more particularly, to a semiconductor memory device for storing data and an operating method thereof.

2. Description of the Related Art

In a NAND flash memory device, a plurality of word lines are arranged between a drain select line and a source select line, and a plurality of memory cells are coupled to each of the word lines. A string coupled between a bit line and a common source line includes a drain select transistor, the plurality of memory cells, and a source select transistor. The drain of the drain select transistor is coupled to the bit line, and the gate of the drain select transistor is coupled to the drain select line. The source of the source select transistor is coupled to the common source line, and the gate of the source select transistor is coupled to the drain select line. The plurality of memory cells is coupled in series between the drain select transistor and the source select transistor, and the gates (that is, control gates) of the memory cells are coupled to the respective word lines. Here, the memory cells are placed on the same column.

In a program operation for storing data, a program voltage is supplied to a word line selected from the word lines. Some of the memory cells coupled to the selected word line are designated as program-inhibited cells depending on data stored in the designated memory cells. Threshold voltages of the program-inhibited cells should not be shifted even if a program voltage is supplied to the program-inhibited cells. A method of preventing the threshold voltages of the program-inhibited cells from shifting is described below.

A program inhibition voltage is supplied to a bit line electrically coupled to a program-inhibited cell, and the channel region of the program-inhibited cell is precharged to the program inhibition voltage. Next, a pass voltage is supplied to the word lines, and a program voltage is then supplied to a selected word line. The channel voltage of the program-inhibited cell is boosted by the pass voltage. Consequently, the threshold voltage of the program-inhibited cell is not shifted because a difference between the boosted channel voltage and the program voltage supplied to the word lines is small.

As described above, the channel voltage of the program-inhibited cell needs to be uniformly raised by channel boosting in all the word lines. The resulting boosted channel voltage, however, changes depending on the position of the word line, which may lead to an error. This is described below.

The number of fail bits for memory cells coupled to a first word line adjacent to the source select line is decreased as a level of the pass voltage supplied to the remaining word lines in a program operation is raised. This problem is created because a channel potential is low at the time of the channel boosting. Furthermore, the number of fail bits for memory cells coupled to the last word line adjacent to the drain select line is decreased as a level of the pass voltage supplied to the remaining word lines in a program operation is lowered. This problem is created because a channel potential is high at the time of the channel boosting.

That is, the number of fail bits (or error bits) is increased because conditions of the channel boosting are fixed, but a degree of the boosted channel voltage is varied depending on the position of a word line between the drain select line and the source select line at the time of the channel boosting.

BRIEF SUMMARY

In accordance with example embodiments, the generation of error bits can be suppressed and a program disturbance phenomenon can be improved by uniformly generating channel boosting in the channel region of a program-inhibited cell irrespective of the position of a word line between a drain select line and a source select line.

An operating method of a semiconductor memory device according to an aspect of the present disclosure includes precharging the channel region of a program-inhibited cell, from among first memory cells coupled to a first word line selected from a first word line group of word line groups between a drain select line and a source select line, to a first level based on first data; performing a first program operation for storing the first data in the first memory cells; precharging the channel region of a program-inhibited cell, from among second memory cells coupled to a second word line selected from a second word line group of the word line groups, to a second level different from the first level based on second data to be stored in the second memory cells; and performing a second program operation for storing the second data in the second memory cells.

When the channel region is precharged to the first level, a program inhibition voltage is supplied to a bit line coupled to the program-inhibited cell, and a first select voltage higher than the first level by the threshold voltage of a drain select transistor is supplied to the drain select line of the drain select transistor for transferring the program inhibition voltage to the program-inhibited cell.

When the channel region is precharged to the first level, the channel regions of memory cells electrically coupled to a bit line in a string including the program-inhibited cell from among the first memory cells are precharged to the first level.

When the channel region is precharged to the second level, a program inhibition voltage is supplied to a bit line coupled to the program-inhibited cell, and a second select voltage higher than the second level by the threshold voltage of a drain select transistor is supplied to the drain select line of the drain select transistor for transferring the program inhibition voltage to the program-inhibited cell.

When the channel region is precharged to the second level, the channel regions of memory cells electrically coupled to a bit line in a string including the program-inhibited cell from among the second memory cells are precharged to the second level.

If the drain select line is closer to the second word line group than the first word line group, the channel region of the program-inhibited cell from among the second memory cells is precharged to the second level lower than the first level.

The word line group may include one word line.

A word line group closer to the drain select line, from among the word line groups, includes a larger number of the word lines.

Each of the word line groups closer to the source select line than the drain select line may include one word line, and each of the word line groups closer to the drain select line than the source select line may include two or more word lines.

Each of the word line groups closer to the source select line than the drain select line may include the same number of the word lines, and each of the word line groups closer to the drain select line than the source select line may include a larger number of the word lines toward the drain select line.

When a program operation is performed for memory cells included in a word line group closer to the source select line than the drain select line, from among the word line groups, the channel region of a program-inhibited cell is precharged to a preset level irrespective of the word line groups.

A semiconductor memory device according to another aspect of the present disclosure includes memory blocks each configured to include memory cells coupled to word lines classified into a plurality of word line groups between a drain select line and a source select line, where the memory cells include a program-inhibited cell comprising a channel region configured to be precharged based on input data, from among memory cells coupled to a word line selected from among the word lines, and where a program operation is performed for storing the input data in the memory cells coupled to the selected word line, and where the precharge level of the channel region of the program-inhibited cell is precharged depending on a position of a word line group including the selected word line between the drain select line and the source select line.

A program inhibition voltage is supplied to a bit line coupled to the program-inhibited cell and supplies a select voltage higher than the target precharge level of the channel region by the threshold voltage of a drain select transistor to the drain select line of the drain select transistor for transferring the program inhibition voltage to the program-inhibited cell so that the channel region is precharged.

When the channel region is precharged, the channel regions of memory cells, from among memory cells included in the same string as the program-inhibited cell, electrically coupled to the bit line are also precharged.

The precharge level of the channel region is lowered as a word line group including the selected word line is closer to the drain select line.

Each of the word line groups may include one word line.

A word line group closer to the drain select line, from among the word line groups, may include a larger number of the word lines.

Each of the word line groups closer to the source select line than the drain select line may include one word line, and each of the word line groups closer to the drain select line than the source select line may include two or more word lines.

Each of the word line groups closer to the source select line than the drain select line may include the same number of the word lines, and each of the word line groups closer to the drain select line than the source select line may include a larger number of the word lines toward the drain select line.

A channel region of a program-inhibited cell is precharged to a preset level irrespective of the word line groups when performing a program operation for memory cells included in a word line group closer to the source select line than the drain select line, from among the word line groups.

BRIEF DESCRIPTION OF THE DRAWINGS

FIG. 2 is a circuit diagram of a memory block shown in FIG. 1;

DESCRIPTION OF EMBODIMENTS

Hereinafter, some example embodiments of the present disclosure will be described in detail with reference to the accompanying drawings. The figures are provided to allow those having ordinary skill in the art to understand the scope of the embodiments of the disclosure.

Figure 1:
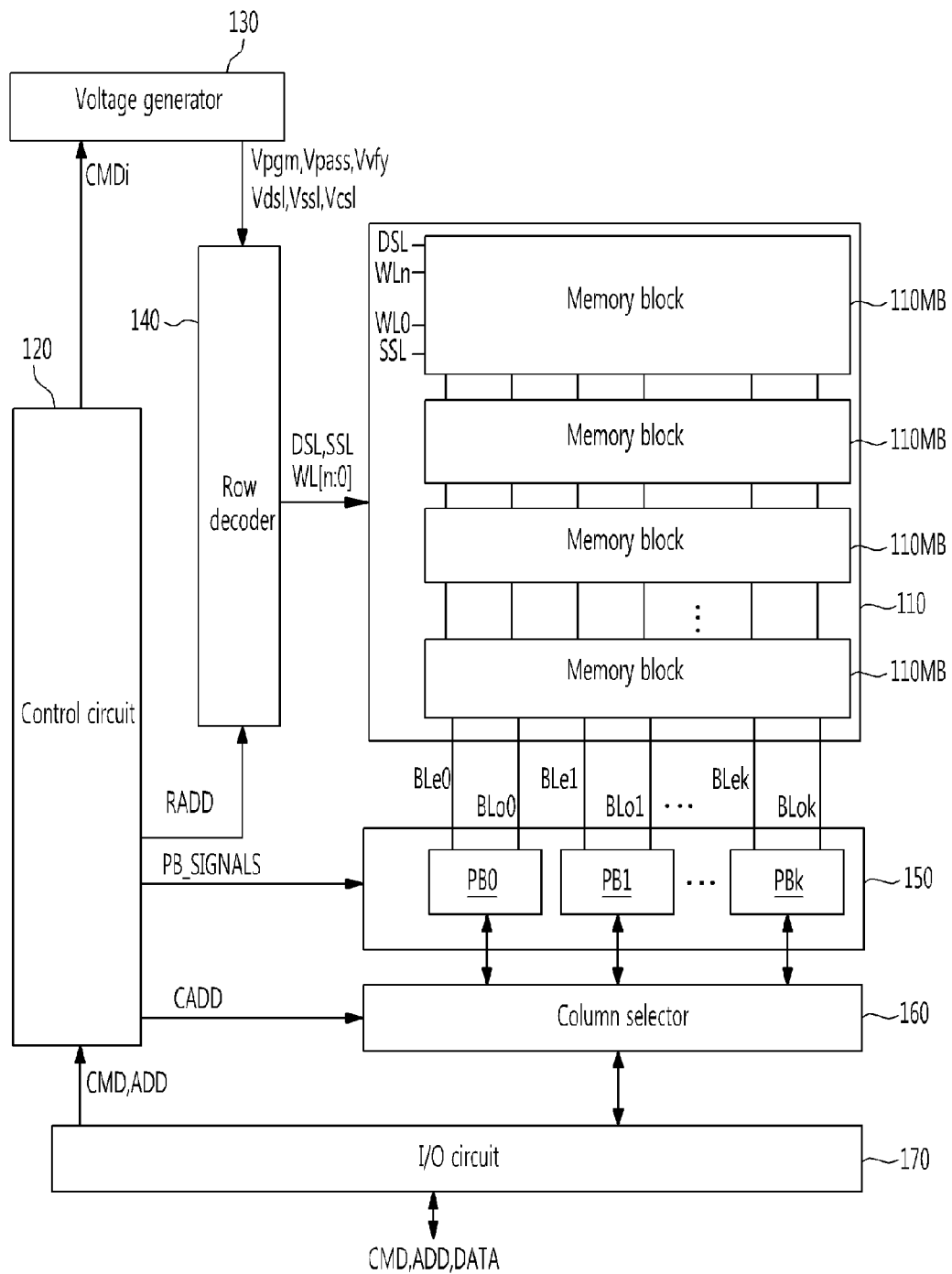
FIG. 1 is a block diagram illustrating a semiconductor memory device according to an embodiment of this disclosure.

FIG. 1 is a block diagram illustrating a semiconductor memory device according to an embodiment of this disclosure.

Referring to FIG. 1, the semiconductor memory device includes a memory array 110, an operation circuit (130 to 170) configured to perform a program operation, a read operation, and an erase operation for inputting and outputting data to and from memory cells included in a page selected from the pages of a memory block 110MB, and a control circuit 120 configured to control the operation circuit (130 to 170). In a NAND flash memory device, the operation circuit includes a voltage supply circuit (130 and 140), a page buffer group 150, a column selector 160, and an I/O circuit 170.

The memory array 110 includes a plurality of memory blocks 110MB. At least one of the memory blocks 110MB may be used as a Content-Addressable Memory (CAM) block for storing configuration information, such as a repair column address for distinguishing unused columns of all the columns from each other. The CAM block has the same construction as the memory block 110MB. The structure of the memory block is described in detail below.

FIG. 2 is a circuit diagram of the memory block shown in FIG. 1.

Referring to FIG. 2, the memory block includes a plurality of strings ST coupled between bit lines BLe0 to BLek and BLo0 to BLok and a common source line CSL. The strings ST are coupled to respective bit lines BLe0 to BLek and BLo0 to Blok, and also coupled to the common source line CSL. Each of the strings ST includes a source select transistor SST having a source coupled to the common source line CSL, a plurality of memory cells Ce00 to Cen0, and a drain select transistor DST having a drain coupled to the bit line BLe0. The memory cells Ce00 to Cen0 are coupled in series between the select transistors SST and DST. The gate of the source select transistor SST is coupled to a source select line SSL, the gates of the memory cells Ce00 to Cen0 are coupled to respective word lines WL0 to WLn, and the gate of the drain select transistor DST is coupled to a drain select line DSL.

A NAND flash memory device may comprise memory cells included in the memory block that may be classified by physical page or logical page. For example, the memory cells Ce00 to Ce0$k$ and Co00 to Co0$k$ coupled to one word line (for example, WL0) may form one physical page PAGE. For another example, the even-numbered memory cells Ce00 to Ce0k coupled to one word line (for example, WL0) may form one even physical page, and the odd-numbered memory cells Co00 to Co0k coupled thereto may form one odd physical page. The page (or the even page and the odd page) is a basic unit of a program operation or a read operation.

The word lines WL0 to WLn may be classified into two or more word line groups. This is described in detail below.

FIGS. 3A to 3D are circuit diagrams illustrating embodiments in which word lines of the memory block are classified by group.

Figure 3A:
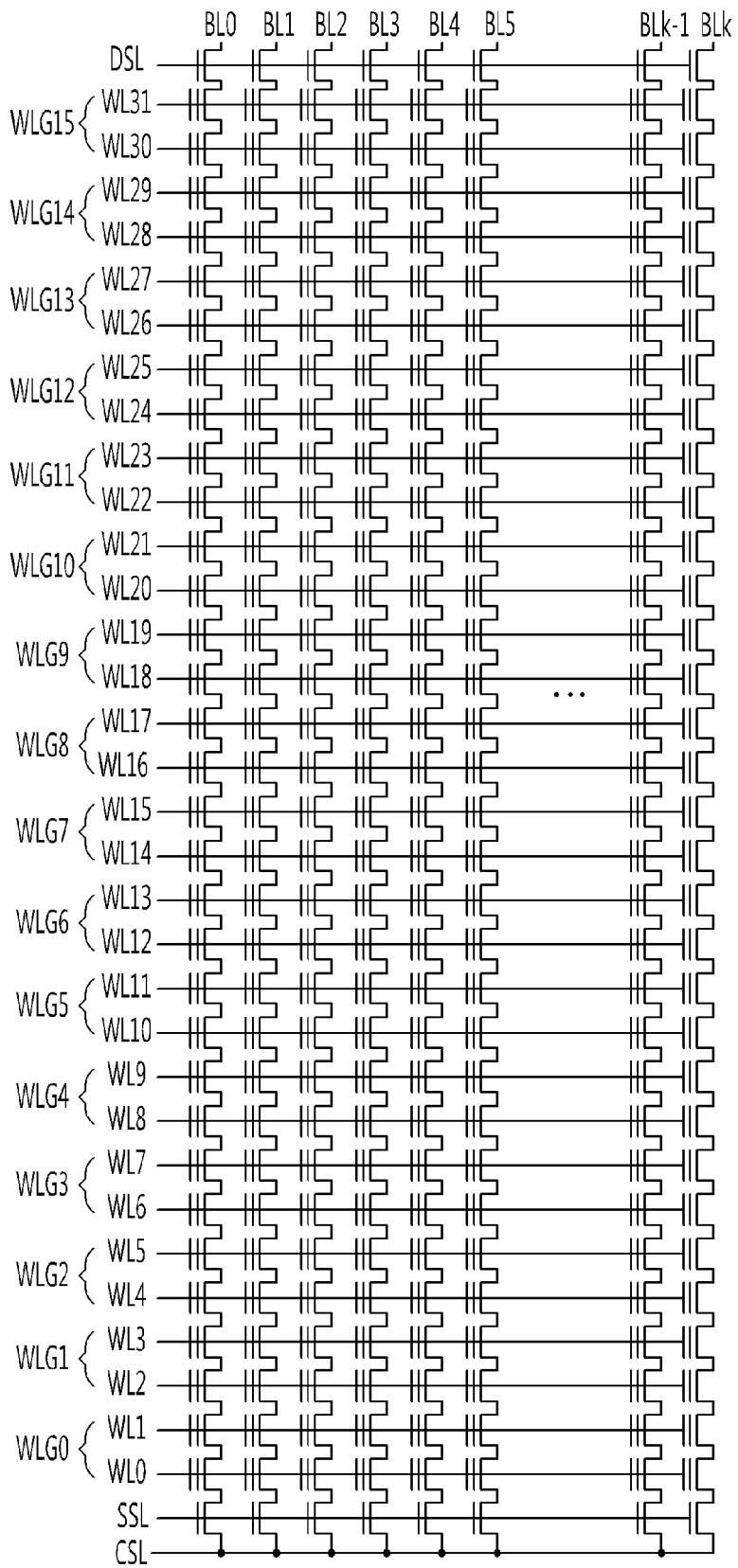
FIGS. 3A to 3D are circuit diagrams illustrating embodiments in which word lines of a memory block are classified by group.

Referring to FIG. 3A, if 32 word lines WL0 to WL31 are included in one memory block, the 32 word lines may be classified by group so that the same number of word lines are included in a word line group. For example, if 2 word lines are defined as one word line group, in one example the 32 word lines WL0 to WL31 may be classified into 16 word line groups WLG0 to WLG15, but this disclosure is not limited thereto. For example, the number of word lines included in each word line group may be 2, 4, 8, or 16.

Figure 3B:
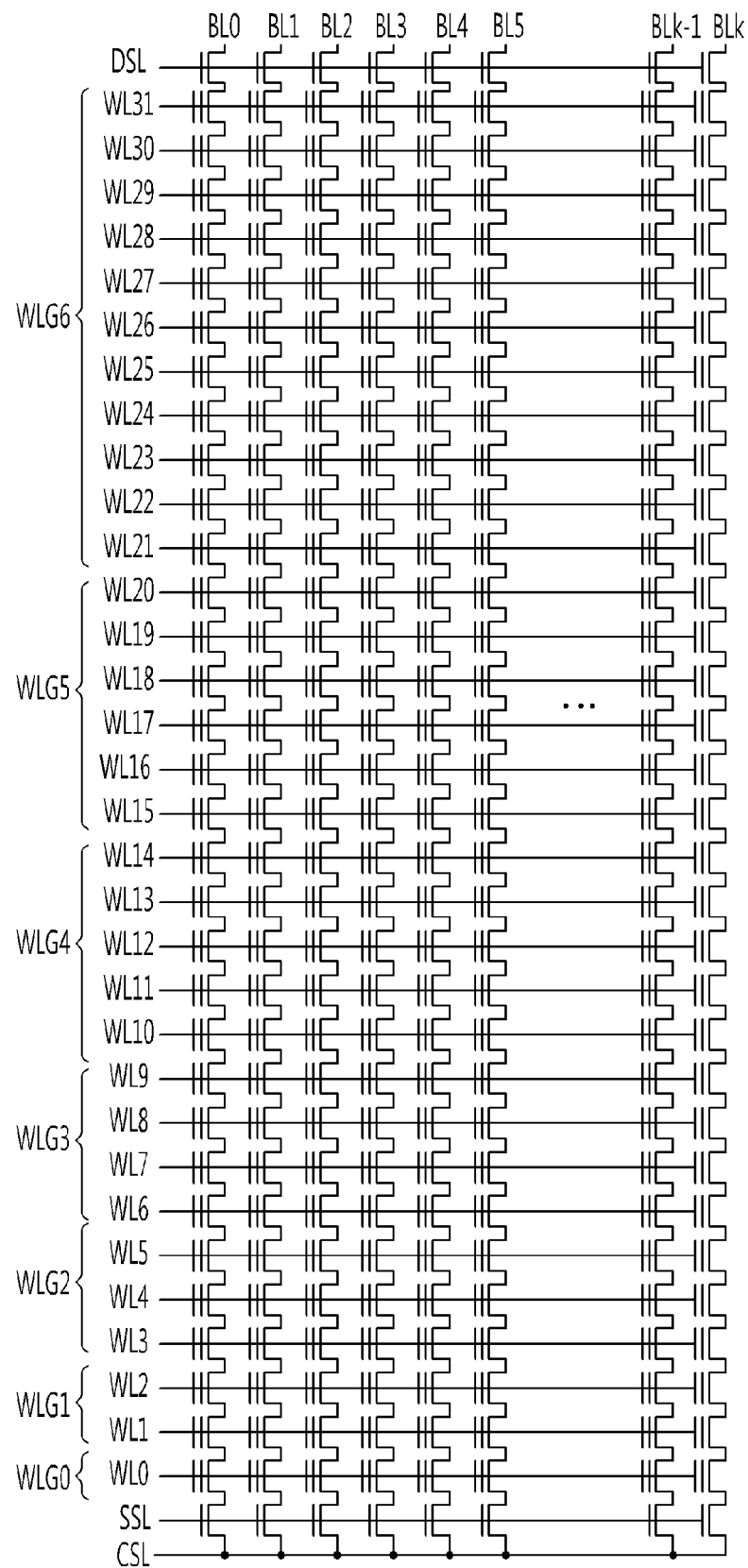

Referring to FIG. 3B, in another example the 32 word lines WL0 to WL31 may be classified into a plurality of word line groups WLG0 to WLG6 so that a word line group (for example, WLG6) close to the drain select line DSL includes a larger number of word lines WL21 to WL31 than a word line group (for example, WLG0) that is closer to the source select line. For example, the number of word lines included in each word line group may be increased according to a sequence of the word line groups so that the first word line group WLG0 which is the farthest from the drain select line DSL, but the closest to the source select line SSL includes one word line WL0 and the second word line group WLG1 next to the first word line group WLG0 includes two word lines WL1 and WL2, etc. Thus, each word line group further from the source select line SSL may include more word lines (for example, one more word line) than a previous word line group which is closer to the source select line.

Figure 3C:
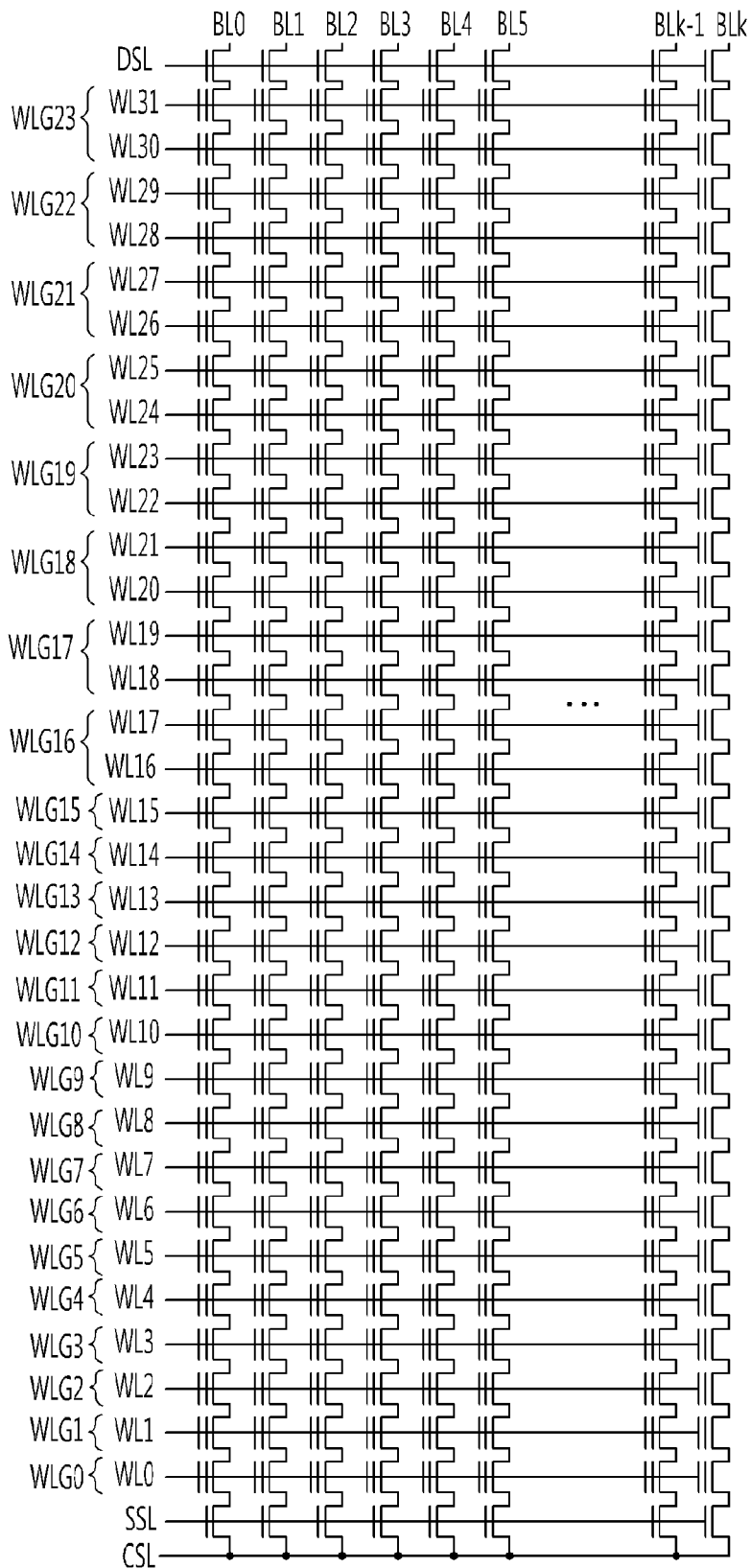

Referring to FIG. 3C, in still another example, the 32 word lines WL0 to WL31 may be classified into a plurality of word line groups WLG0 to WLG23 so that each of the word line groups WLG0 to WLG15 closer to the source select line SSL than the drain select line DSL includes one word line; and each of the word line groups WLG16 to WLG23 closer to the drain select line DSL include more than one word line. Here, the same number of word lines (for example, 2 word lines) may be included in each of the word line groups WLG16 to WLG23.

In this case, because the word line groups WLG0 to WLG15, include only one word line, these groups do not have to be classified as word line groups. The word lines WL0 to WL15 included in the word line groups WLG0 to WLG15 may be referred to by their word line designation. Thus, WLG0 may be referred to as WL0. Thus, in this example, only the word lines WL16 to WL31, which are closer to the drain select line DSL than the source select line SSL, need to be classified into the word line groups WLG16 to WLG23.

Figure 3D:
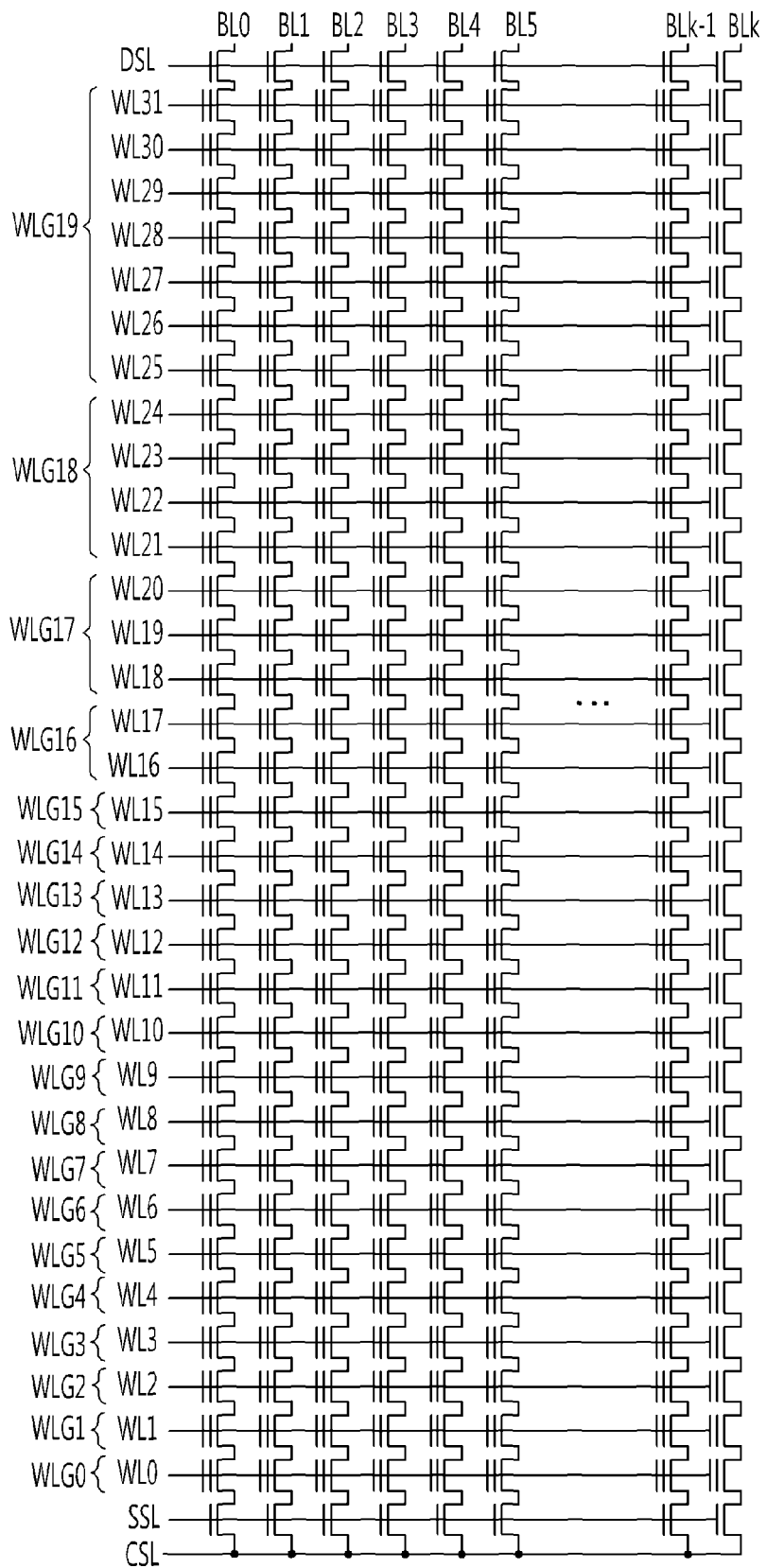

Referring to FIG. 3D, the 32 word lines WL0 to WL31 may be classified into a plurality of word line groups WLG0 to WLG19 where each of the word line groups WLG0 to WLG15 that are closer to the source select line SSL includes the same number of word lines; and each of the word line groups WLG16 to WLG19 closer to the drain select line DSL includes an increasingly larger number of the word lines in each group that is closer to the drain select line DSL. Thus the word line group WLG16, which is farther from the drain select line DSL than word line group WLG17, contains two word lines (WL16 to WL17), while the word line group WLG17 contains three word lines (WL18 to WL20). And the word line group WLG 18, which is closer to the drain select line DSL than WLG 17, contains four word lines (WL21 to WL24).

In one example, because word lines WL0 to WL15, each include only one word line, these word lines do not necessarily have be classified by word line group.

In another example, one word line may be defined as one word line group. In this case, the word line and the word line group are the same unit.

Word lines may be classified by word line groups to set a different voltage level to which the channel region of a program-inhibited cell is precharged for every word line included in a word line group in a program operation. In the word line grouping method described with reference to FIG. 3C or 3D, each of the word line groups WLG0 to WLG15, closer to the source select line SSL than the drain select line DSL, includes only one word line. Thus, when a program operation is performed for memory cells included in the word line groups WLG0 to WLG15, the channel regions of program-inhibited cells can be precharged to the same level irrespective of the word line group designation of these word lines WL0 to WL15. This will be described later.

Referring back to FIG. 1, the control circuit 120 generates an internal command signal CMDi for controlling the voltage generator 130 and PB control signals PB_SIGNALS for controlling page buffers PB0 to PBk included in the page buffer group 150 for data that is input and output to the page buffers PB0 to PBk, where the data may be input and output in response to a command signal CMD externally received via the I/O circuit 170. Furthermore, the control circuit 120 generates a row address signal RADD and a column address signal CADD in response to an address signal ADD. The row address signal RADD is generated to distinguish a selected memory block and unselected memory blocks from each other, and the column address signal CADD is generated to sequentially select the page buffers PB0 to PBk of the page buffer group 150. In particular, when a program operation for storing data is performed, the control circuit 120 controls the operation circuit (130 to 170) in order to change a level to which the channel region of a program-inhibited cell is precharged, where the channel region of a program-inhibited cell may be precharged depending on the position of a word line group between the drain select line DSL and the source select line SSL.

The voltage supply circuit (130, 140) supplies local lines (for example, DSL, WL0 to WLn, SSL, and CSL) of a selected memory block with operating voltages (for example, Vpgm, Vpass, Vvfy, Vdsl, Vssl, and Vcsl) necessary for data input and output operations of memory cells in response to the internal command signal CMDi of the control circuit 120. The voltage supply circuit includes the voltage generator 130 and the row decoder 140.

The voltage generator 130 supplies global lines with operating voltages (for example, Vpgm, Vpass, Vvfy, Vdsl, Vssl, and Vcsl) necessary for data input and output operations of memory cells in response to the internal command signal CMDi of the control circuit 120. For example, the voltage generator 130 may supply the program voltage Vpgm to a global line to be coupled to a selected local word line, the program pass voltage Vpass to global lines to be coupled to unselected local word lines, the select voltages Vdsl and Vssl to global select lines to be coupled to the local select lines, and the source voltage Vcsl to the common source line CSL in the program operation.

As previously described, the channel region of a program-inhibited cell may be precharged to a different level depending on the position of a word line group WLG, including the program-inhibited cell, in relation to the drain select line DSL and the source select line SSL. Accordingly, in order to set the precharge level of the channel region of a program-inhibited cell based on its position relative to the drain select line DLS and source SSL, the voltage generator 130 changes the select voltage Vdsl to be supplied to the drain select line DSL depending on the position of the word line group in response to the internal command signal CMDi of the control circuit 120.

Furthermore, the voltage generator 130 generates the erase verify voltage Vvfy to be supplied to a selected word line, the program pass voltage Vpass to be supplied to unselected word lines, the select voltages Vdsl and Vssl to be supplied to the select lines DSL and SSL, and the source voltage Vcsl to be supplied to the common source line CSL when a program verify operation is performed.

In a program operation using an Incremental Step Pulse Program (ISPP) method, the voltage generator 130 may raise the program voltage Vpgm by stages. Furthermore, the voltage generator 130 generates a pass voltage Vpass having a higher level in a program operation than in a program verify operation.

The row decoder 140 couples the global lines to the local lines DSL, WL0 to WLn, and SSL of the memory block 110MB selected from the memory array 110 so that the operating voltages outputted from the voltage generator 130 to the global lines can be transferred to the local lines DSL, WL0 to WLn, and SSL of the selected memory block, in response to the row address signals RADD of the control circuit 120.

The page buffer group 150 includes the plurality of page buffers PB0 to PBk coupled to the memory array 110 through the bit lines BLe0 to BLek and BLo0 to Blok. In response to PB control signals PB_SIGNALS communicated from the control circuit 120, the page buffers PB0 to PBk of the page buffer group 150 selectively precharges the bit lines BLe0 to BLek or BLo0 to Blok according to received data in order to store data in memory cells, or the page buffers PB0 to PBk of the page buffer group 150, senses voltages of the bit lines BLe0 to BLek or BLo0 to BLok in order to read data from memory cells.

Particularly, each of the page buffers PB0 to PBk supplies a program inhibition voltage to a bit line electrically coupled to the program-inhibited cell when a program operation is performed, where the program inhibition voltage may be for precharging the channel region of a program-inhibited cell. In order to set a level to which the channel region of the program-inhibited cell is precharged, where the precharge level is dependent on the position of a word line group including a word line selected for the program operation, the page buffer may change the program inhibition voltage to be supplied to the bit line depending on the position of the word line group in response to the PB control signals PB_SIGNALS of the control circuit 120. That is, the level to which the channel region of the program-inhibited cell is precharged may be controlled based on the select voltage Vdsl supplied from the voltage generator 130 to the drain select line DSL or the program inhibition voltage supplied from the page buffer to the bit line.

The column selector 160 selects the page buffers PB0 to PBk of the page buffer group 150 in response to the column address CADD. That is, the column selector 160 sequentially transfers data to be stored in memory cells in a program operation to the page buffers PB0 to PBk in response to the column address CADD. Furthermore, in a read operation, the column selector 160 sequentially selects the page buffers PB0 to PBk in response to the column address CADD so that the data of memory cells latched in the page buffers PB0 to PBk can be externally outputted.

The I/O circuit 170 transfers external input data to the column selector 160 under control of the control circuit 120 in order to input the external input data to the page buffer group 150 so that the external input data is stored in memory cells in a program operation. When the external input data is inputted to the page buffers PB0 to PBk of the page buffer group 150 as described above, the page buffers PB0 to PBk store the external input data in their internal latch circuits. In a read operation, the I/O circuit 170 also externally outputs the data transferred from the page buffers PB0 to PBk of the page buffer group 150 via the column selector 160.

An operating method of the semiconductor memory device constructed as above according to an embodiment of this disclosure is described below. For reference, all the operations to be described later, such as an operation of supplying the program voltage Vpgm, an operation of supplying the program pass voltage Vpass, an operation of supplying the program inhibition voltage, and an operation of precharging the channel region, are performed by the operation circuit (130 to 170) under the control of the control circuit 120.

Figure 4:
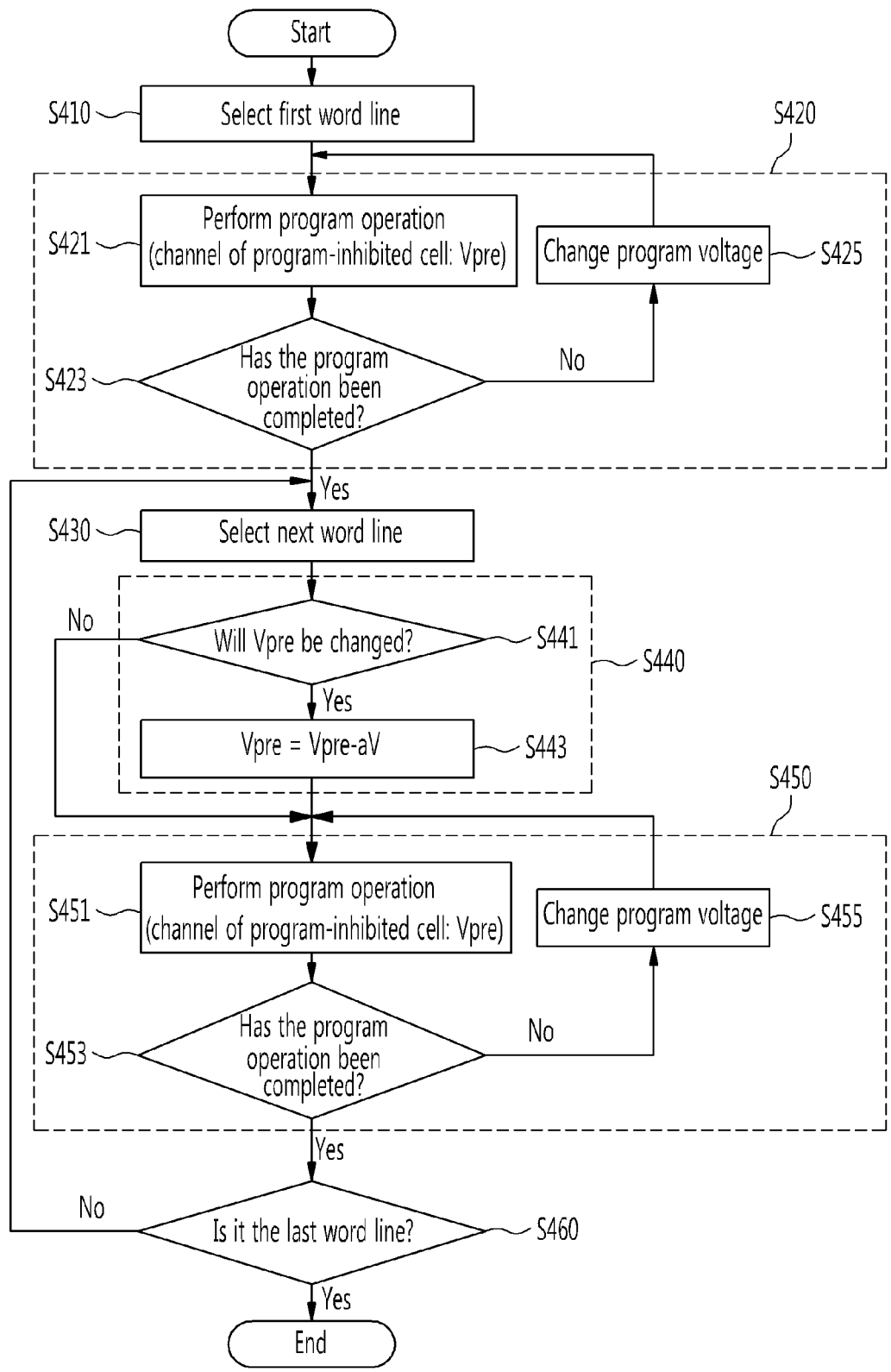
FIG. 4 is a flowchart illustrating an operating method of the semiconductor memory device according to an embodiment of this disclosure.
Figure 5A:
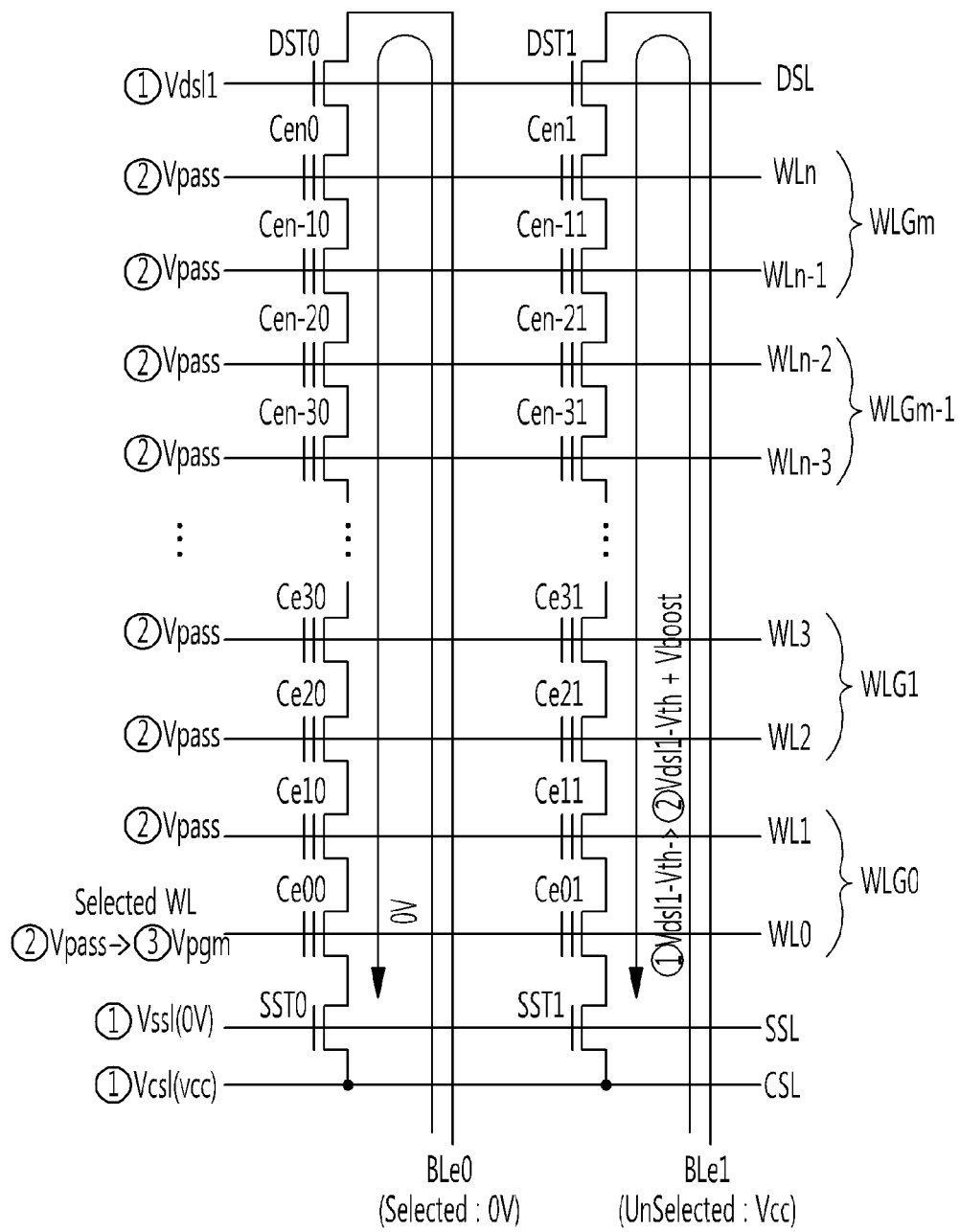
FIGS. 5A to 5C are circuit diagrams illustrating operating methods of the semiconductor memory device according to embodiments of this disclosure.
Figure 5B:
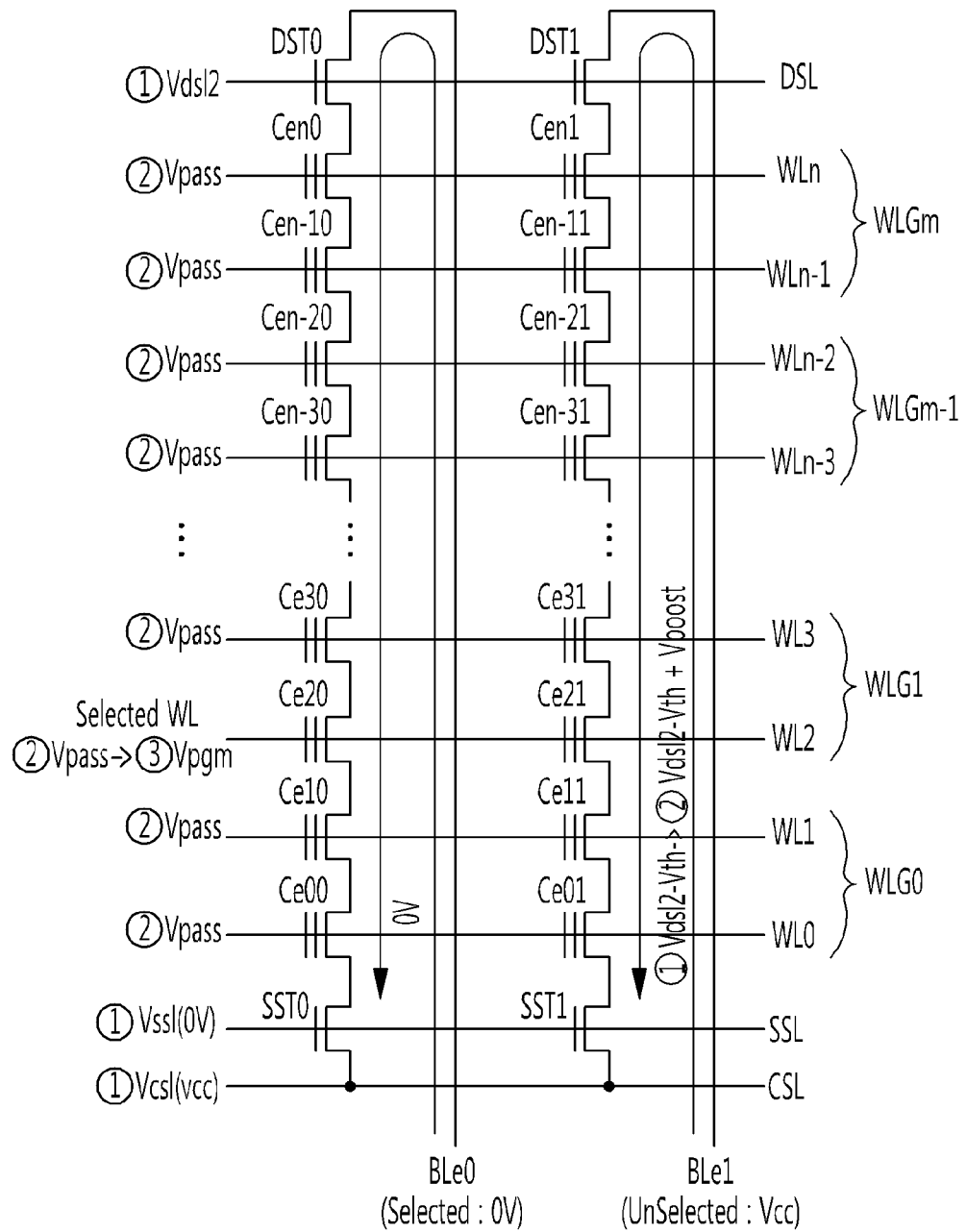
Figure 5C:
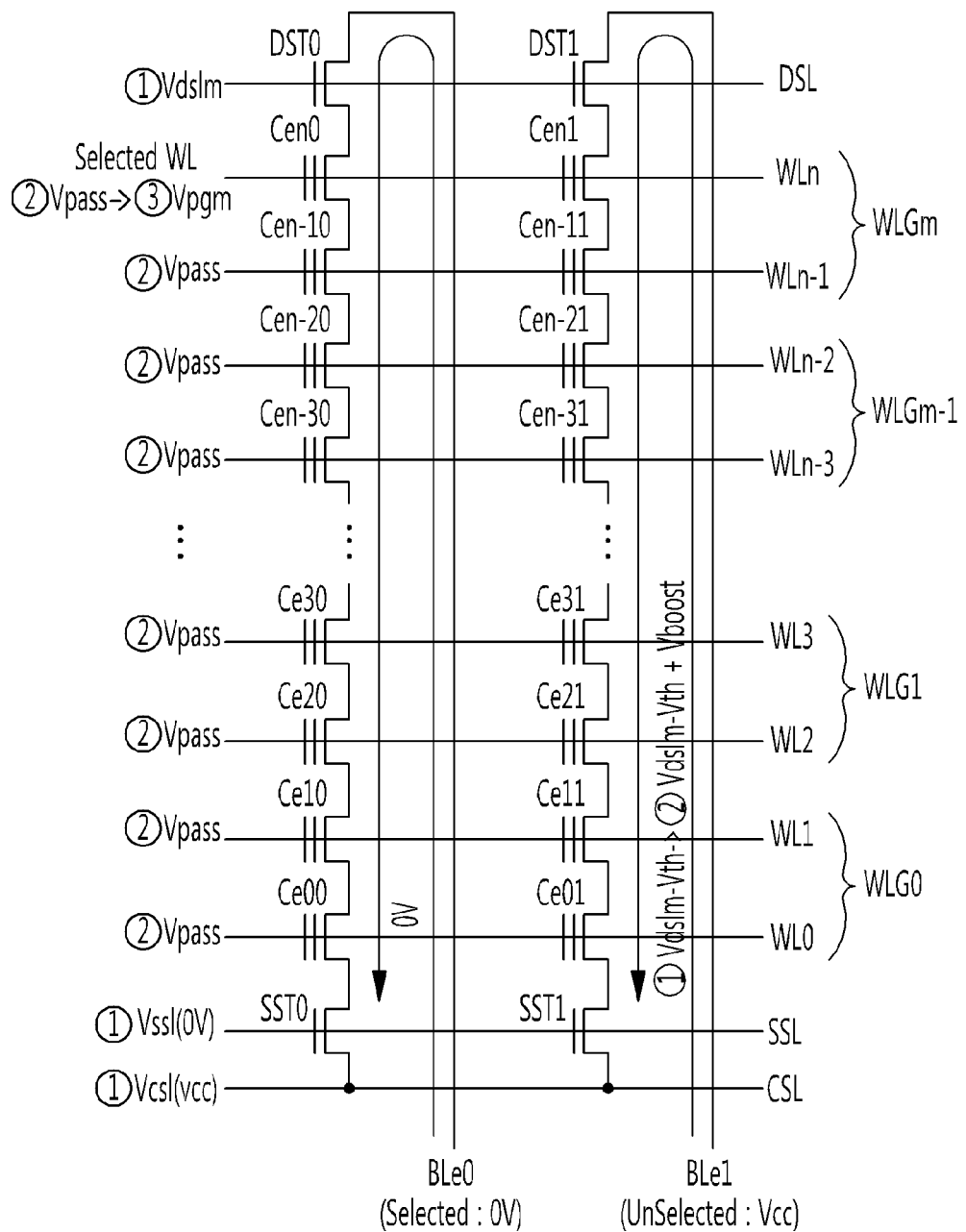

FIG. 4 is a flowchart illustrating an operating method of the semiconductor memory device according to an embodiment of this disclosure. FIGS. 5A to 5C are circuit diagrams that may be used in conjunction with explaining operating methods of the semiconductor memory device according to embodiments of this disclosure.

Referring to FIG. 4, at step S410, for a program operation, a first word line is selected. Furthermore, at step S410, data to be stored in selected memory cells coupled to the first word line is latched in relevant page buffers. Program-inhibited cells, from among the selected memory cells, are determined based on the data latched in the page buffers.

At step S420, a program loop for storing the latched data in the selected memory cells is performed. If the program loop is performed in accordance with an Incremental Step Pulse Program (ISPP) method, the program loop includes a program operation, a program verify operation, and an operation of changing the program voltage Vpgm. This is described in detail below.

Referring to FIGS. 4 and 5A, at step S421, the program operation is performed in order to raise the threshold voltages of the selected memory cells based on the latched data. Here, if data '0' is sought to be stored, the threshold voltage of a memory cell (for example, Ce00) is raised. If data '1' is sought to be stored, the threshold voltage of a memory cell (for example, Ce01) remains unchanged. For the program operation, the program voltage Vpgm is supplied to both the memory cells Ce00 and Ce01 coupled to the first word line WL0. In order to prevent the threshold voltage of the program-inhibited cell Ce01 in which data '1' is stored from being shifted, the channel region of the program-inhibited cell Ce01 must be precharged before the pass voltage Vpass and the program voltage Vpgm are supplied. In order to precharge the channel region of the program-inhibited cell Ce01, the program inhibition voltage (for example, Vcc) is supplied to the bit line BLe1, and the select voltage Vdsl1 higher than a precharge level by the threshold voltage of the drain select transistor DST1 is supplied to the drain select line DSL of the drain select transistor DST1 for transferring the program inhibition voltage Vcc to the program-inhibited cell Ce01. Thus, the program inhibition voltage Vcc is transferred to the channel region of the program-inhibited cell Ce01 via the drain select transistor DST1, and the precharge level Vpre of the channel region of the program-inhibited cell Ce01 rises to a first level (Vdsl1−Vth). When the channel region of the program-inhibited cell Ce01 is precharged, all the channel regions of the memory cells Ce11 to Cen1 electrically coupled to the bit line BLe1 in the string including the program-inhibited cell Ce01 are precharged to the first level (Vdsl1−Vth).

A program permission voltage (for example, 0 V) is supplied to the bit line BLe0 of the memory cell Ce00 in which data '0' is stored, and the channel region of the memory cell Ce00 is discharged.

Next, the pass voltage Vpass is supplied to the word lines WL0 to WLn. When the pass voltage Vpass is supplied, the channel voltage rises to a boosting level (Vdsl1−Vth+Vboost) in the channel region of the program-inhibited cell Ce01 owing to a capacitor coupling phenomenon. Here, the drain select transistor DST1 is turned off.

After the channel voltage of the program-inhibited cell Ce01 rises to the boosting level (Vdsl1−Vth+Vboost), the program voltage Vpgm is supplied to the first word line WL0 of the word line group WLG0. The threshold voltage of the memory cell Ce00 rises because electrons are injected into the floating gate of the memory cell Ce00 owing to a great difference between the program voltage Vpgm and the channel voltage of the memory cell Ce00. The threshold voltage of the program-inhibited cell Ce01, however, remains unchanged because electrons are not injected into the floating gate of the program-inhibited cell Ce01 owing to a small difference between the program voltage Vpgm and the channel voltage of the program-inhibited cell Ce01.

At step S423, it is determined whether the threshold voltage of the memory cell Ce00 has risen to a target level, and the program verify operation for determining whether the program operation has been completed is performed. The program verify operation is well known, and a detailed description thereof is omitted.

If, as a result of the determination, the threshold voltage of the memory cell Ce00 has not risen to the target level, an operation for raising the program voltage by a step voltage is performed at step S425. Next, the program operation S421 and the program verify operation S423 are performed again. The program loop S420 is repeatedly performed until the threshold voltage of the memory cell Ce00 rises to the target level.

If, as a result of the determination, the threshold voltage of the memory cell Ce00 has risen to the target level, a next word line is selected at step S430.

At step S440, it is determined whether the precharge level Vpre of the channel region of the program-inhibited cell will be changed. More specifically, at step S440, whether the precharge level Vpre will be changed is determined. For example, it is determined whether the next word line selected after the program operation is completed at step S420 is a word line selected from the same word line group as the previous word line, or if the word line is selected from a different or next word line group. This operation may be performed by sensing a row address. If the word line for which the program loop has completed and a word line selected for a next program loop belongs to different word line groups (for example, WLG0 and WLG1) (that is, the next word lines are selected from a different word line group, for example, WLG1), the precharge level Vpre of the channel region of the program-inhibited cell is set to be lowered by a voltage aV at step S433. If the next word line is selected from the same word line group (for example, WLG0), the precharge level Vpre of the channel region of the program-inhibited cell is unchanged.

Referring to FIGS. 4 and 5B, if a word line (for example, WL2) for a next program loop is selected from another word line group (for example, WLG1) closer to the drain select line DSL at step S430, a program loop for storing other data in the memory cells Ce20 and Ce21 coupled to the word line WL2 is performed at step S450 after the channel region of the program-inhibited cell is precharged to a changed level. This program loop is described in detail below.

At step S451, a program operation is performed to raise the threshold voltage of a memory cell (for example, Ce20) selected based on data latched in the page buffers so as to store the latched data in the memory cells Ce20 and Ce21 of the word line WL2. As in the step S421, if data '0' is sought to be stored, the threshold voltage of a memory cell (for example, Ce20) is raised. If data '1' is sought to be stored, the threshold voltage of a memory cell (for example, Ce21) remains unchanged.

In order to precharge the channel region of the program-inhibited cell Ce21, the program inhibition voltage (for example, Vcc) is supplied to the bit line BLe1, and the select voltage Vdsl2 (higher than the precharge level Vpre by the threshold voltage of the drain select transistor DST1) is supplied to the drain select line DSL of the drain select transistor DST1. The select voltage Vdsl2 may be applied to transfer the program inhibition voltage Vcc to the program-inhibited cell Ce21. Here, the precharge level Vpre of the channel region of the program-inhibited cell Ce21 becomes lower than the precharge level Vpre of the channel region of the program-inhibited cell Ce01 by the voltage aV. Accordingly, the select voltage Vdsl2 is supplied, where the select voltage Vdls2 has a lower level than the select voltage Vdsl1 supplied in the previous program operation S421 by the voltage aV.

Accordingly, the program inhibition voltage Vcc is transferred to the channel region of the program-inhibited cell Ce21 via the drain select transistor DST, and the precharge level Vpre of the channel region of the program-inhibited cell Ce21 rises to a second level (Vdsl2−Vth) which is lower than the first level (Vdsl1−Vth) by the voltage aV. When the channel region of the program-inhibited cell Ce21 is precharged, all the channel regions of the memory cells Ce31 to Cen1 electrically coupled to the bit line BLe1 in the string including the program-inhibited cell Ce21 are precharged to the second level (Vdsl2−Vth).

A program permission voltage (for example, 0 V) is supplied to the bit line BLe0 of the memory cell Ce20 in which data '0' is stored, and the channel region of the memory cell Ce20 is discharged.

Next, the pass voltage Vpass is supplied to the word lines WL0 to WLn. When the pass voltage Vpass is supplied, the channel voltage rises to a boosting level (Vdsl2−Vth+Vboost) in the channel region of the program-inhibited cell Ce21 owing to a capacitor coupling phenomenon. Here, the drain select transistor DST1 is turned off.

After the channel voltage of the program-inhibited cell Ce21 rises to the boosting level (Vdsl2−Vth+Vboost) by channel boosting, the program voltage Vpgm is supplied to the word line WL2. The threshold voltage of the memory cell Ce20 rises because electrons are injected into the floating gate of the memory cell Ce20 owing to a great difference between the program voltage Vpgm and the channel voltage of the memory cell Ce20. The threshold voltage of the program-inhibited cell Ce21, however, remains unchanged because electrons are not injected into the floating gate of the program-inhibited cell Ce21 because the difference between the program voltage Vpgm and the channel voltage of the program-inhibited cell Ce21 is small.

A channel boosting phenomenon is more easily generated in the program-inhibited cell Ce21 as opposed to the program inhibited cell Ce01, because the program-inhibited cell Ce21 is closer to the drain select line DSL than the program-inhibited cell Ce01. Accordingly, although the channel voltage is boosted after the channel region of the program-inhibited cell Ce21 is precharged lower than the channel region of the program-inhibited cell Ce01, the program-inhibited cell Ce01 and the program-inhibited cell Ce21 have the same channel voltage after the boosting. As a result, the channel voltages can be uniformly raised to the same level irrespective of the positions of the program-inhibited cells Ce01 and Ce21 or the distances of the program-inhibited cells Ce01 and Ce21 from the drain select line DSL.

At step S453, a program verify operation is performed in order to determine whether the threshold voltage of the memory cell Ce20 has risen to the target level. If, as a result of the determination, the threshold voltage of the memory cell Ce20 is lower than the target level, the program voltage Vpgm is raised by the step voltage at step S455, and the program operation S451 and the program verify operation S453 are then performed again. Likewise, the program loop S450 is repeatedly performed up to a set number of times until the threshold voltage of the memory cell Ce20 rises to the target level.

At step S460, it is determined whether a word line for which the program loop has been performed is the last word line. If, as a result of the determination, the word line is not the last word line within the memory block, the steps S430, S440, and S450 are repeatedly performed until the last word line is selected.

Referring to FIGS. 4 and 5C, if the last word line WLn is selected at step S430, a level to which the channel region of the program-inhibited cell Cen1 is precharged is determined at step S440. At step S451, the channel region of the program-inhibited cell Cen1 is precharged to the lowest level (Vdlsm−Vth) as compared with other program-inhibited cells based on the determined precharge level. The precharged channel voltage is then raised to a boosting level (Vdlsm−Vth+Vboost) by supplying the pass voltage Vpass and the program voltage Vpgm to the word lines WL0 to WLn. This operation is performed like the previous operation except that only the select voltage Vdslm supplied to the drain select line DSL is changed.

Next, the steps S453 and S455 are performed. At step S460, the entire operation is finished if the word line WLn for which the program loop has been performed is determined to be the last word line.

As described above, a level to which a channel voltage rises in the channel region of a program-inhibited cell is controlled so that it uniformly becomes a preset level irrespective of the position of a word line selected for a program loop between the drain select line DSL and the source select line SSL. Accordingly, the generation of an error bit can be suppressed, and a program disturbance phenomenon can be improved.

It has been described that a level to which the channel region of a program-inhibited cell is precharged is changed by word line group. However, when a program operation for memory cells included in word line groups closer to the source select line SSL than the drain select line DSL is performed by the operation circuit, the channel region of a program-inhibited cell may be precharged to a preset level irrespective of the word line groups.

Figure 6:
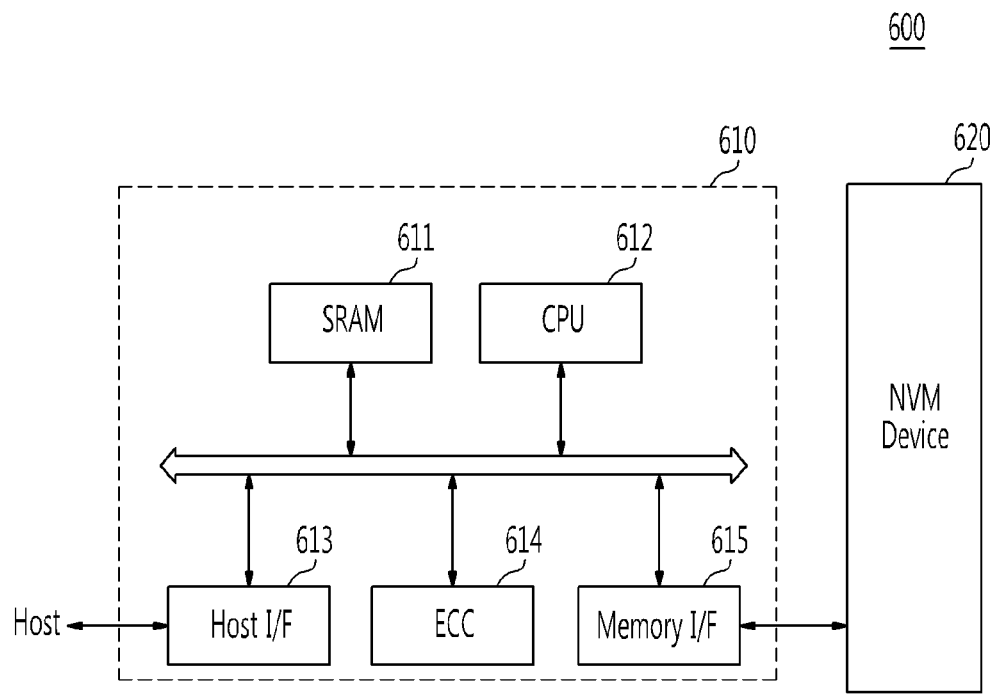
FIG. 6 is a simplified block diagram of a memory system according to an embodiment of this disclosure.

FIG. 6 is a simplified block diagram of a memory system according to an embodiment of this disclosure.

Referring to FIG. 6, the memory system 600 according to an embodiment of this disclosure includes a non-volatile memory device 620 and a memory controller 610.

The non-volatile memory device 620 may be formed of the above-described semiconductor memory device. The memory controller 610 may be configured to control the non-volatile memory device 620. The non-volatile memory device 620 and the memory controller 610 may be combined to provide a memory card or a Solid State Disk (SSD). SRAM 611 is used as the operating memory of a CPU 612. A host interface (I/F) 613 is equipped with the data exchange protocol of a host coupled to the memory system 600. An error correction (ECC) block 614 detects and corrects errors included in data read from the non-volatile memory device 620. A memory interface (I/F) 615 provides an interface with the non-volatile memory device 620 of this disclosure. The CPU 612 performs an overall control operation for the data exchange of the memory controller 610.

Although not shown, it will be evident to those skilled in the art that the memory system 600 according to this disclosure may further include ROM (not shown) for storing code data for an interface with the host. The non-volatile memory device 620 may be provided in the form of a multi-chip package including a plurality of flash memory chips. The memory system 600 may be provided as a storage medium having a low error probability and high reliability. Particularly, the flash memory device of this disclosure may be included in a memory system, such as a Solid State Disk (SSD) that has been recently actively researched. In this case, the memory controller 610 may be configured to communicate with the outside (for example, the host) through one of various interface protocols, such as a USB, MMC, PCI-E, SATA, PATA, SCSI, ESDI, and IDE.

Figure 7:
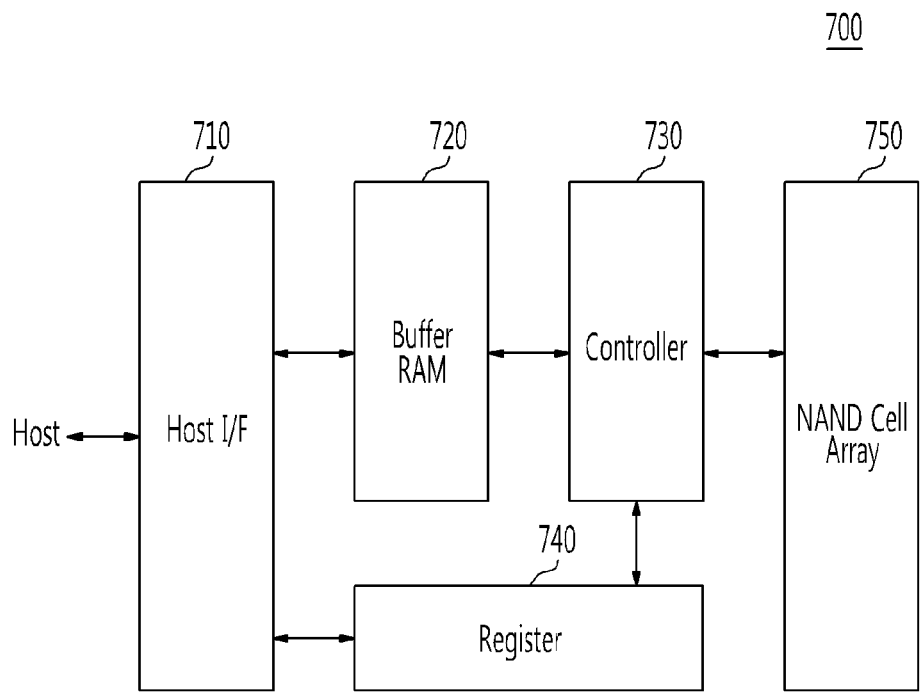
FIG. 7 is a simplified block diagram of a fusion memory device or a fusion memory system that performs a program operation according to the various embodiments.

FIG. 7 is a simplified block diagram of a fusion memory device or a fusion memory system that performs a program operation according to the various embodiments. For example, the technical characteristic of this disclosure may be applied to OneNAND flash memory device 700 which is an example of the fusion memory device.

The OneNAND flash memory device 700 includes a host interface (I/F) 710 configured to exchange various pieces of information with devices using different protocols, buffer RAM 720 configured to embed codes for driving the memory device or buffer data, a controller 730 configured to control reading, programming, and all states in response to external control signals and commands, a register 740 configured to store commands, addresses, and configuration data to define a system operation environment within the memory device, and a NAND cell array 750 configured to include non-volatile memory cells and an operation circuit including page buffers. The OneNAND flash memory device 700 programs data as described above in response to a write request from the host.

Figure 8:
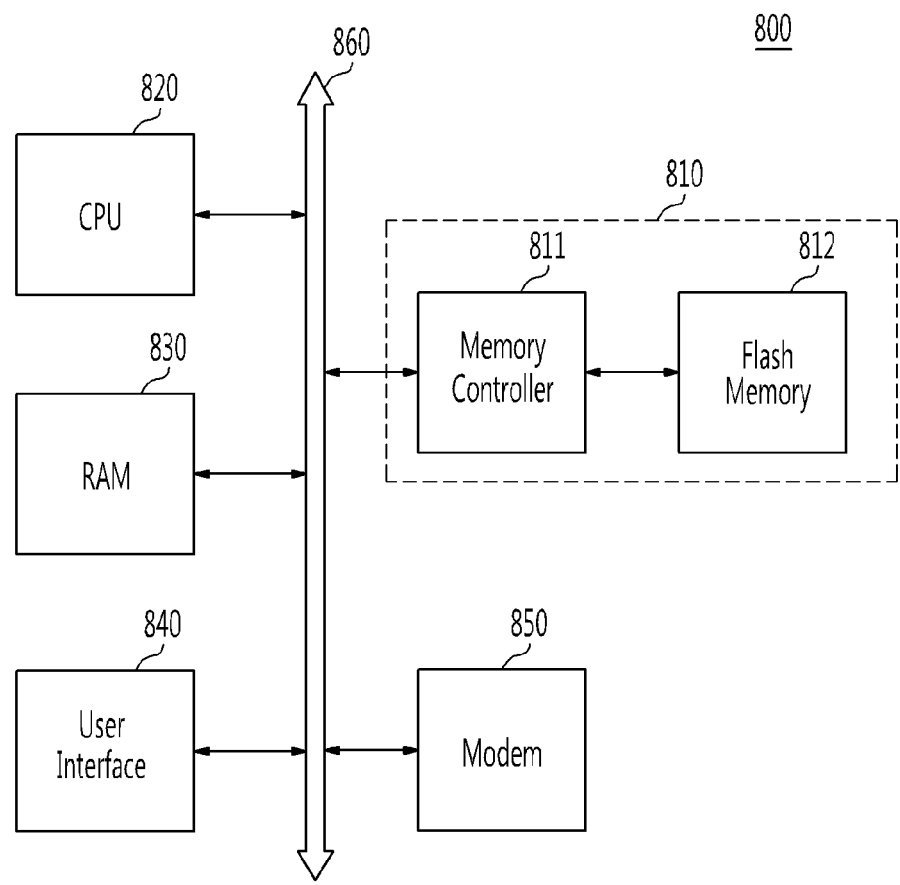
FIG. 8 is a simplified block diagram of a computing system including the flash memory device according to an embodiment of this disclosure.

FIG. 8 is a simplified block diagram of a computing system 800 including a flash memory device 812 according to an embodiment of this disclosure.

The computing system 800 according to this disclosure includes a CPU 820, RAM 830, a user interface 840, a modem 850, such as a baseband chipset, and a memory system 810 which are electrically coupled to a system bus 860. If the computing system 800 according to this disclosure is a mobile device, a battery (not shown) for supplying operating voltages to the computing system 800 may be further included. Although not shown, those skilled in the art will appreciate that the computing system 800 of this disclosure may further include other elements, such as an application chipset, a Camera Image Processor (CIS), and mobile DRAM. The memory system 810 may form, for example, a Solid State Drive/Disk (SSD) used as non-volatile memory for storing data. In some embodiments, the memory system 810 may be provided as fusion flash memory (for example, OneNAND flash memory).

According to this disclosure, the generation of an error bit can be suppressed and a program disturbance phenomenon can be improved because channel boosting is uniformly generated in the channel region of a program-inhibited cell irrespective of the position of a word line selected in relation to the drain select line and the source select line.

What is claimed is:

1. An operating method of a semiconductor memory device, comprising:
    precharging a channel region of a program-inhibited cell, from among first memory cells coupled to a first word line selected from a first word line group of word line groups between a drain select line and a source select line, to a first level based on first data;
    performing a first program operation for storing the first data in the first memory cells;
    precharging a channel region of a program-inhibited cell, from among second memory cells coupled to a second word line selected from a second word line group of the word line groups, to a second level different from the first level based on second data; and
    performing a second program operation for storing the second data in the second memory cells.

2. The operating method of claim 1, wherein when the channel region is precharged to the first level, a program inhibition voltage is supplied to a bit line coupled to the program-inhibited cell, and a first select voltage higher than the first level by a threshold voltage of a drain select transistor is supplied to the drain select line of the drain select transistor for transferring the program inhibition voltage to the program-inhibited cell.

3. The operating method of claim 1, wherein when the channel region is precharged to the first level, channel regions of memory cells electrically coupled to a bit line in a string including the program-inhibited cell from among the first memory cells are precharged to the first level.

4. The operating method of claim 1, wherein when the channel region is precharged to the second level, a program inhibition voltage is supplied to a bit line coupled to the program-inhibited cell, and a second select voltage higher than the second level by a threshold voltage of a drain select transistor is supplied to the drain select line of the drain select transistor for transferring the program inhibition voltage to the program-inhibited cell.

5. The operating method of claim 1, wherein when the channel region is precharged to the second level, channel regions of memory cells electrically coupled to a bit line in a string including the program-inhibited cell from among the second memory cells are precharged to the second level.

6. The operating method of claim 1, wherein if the drain select line is closer to the second word line group than the first word line group, the channel region of the program-inhibited cell from among the second memory cells is precharged to the second level lower than the first level.

7. The operating method of claim 1, wherein the word line group includes one word line.

8. The operating method of claim 1, wherein a word line group closer to the drain select line, from among the word line groups, includes a larger number of the word lines.

9. The operating method of claim 1, wherein:
    each of the word line groups closer to the source select line than the drain select line includes one word line, and
    each of the word line groups closer to the drain select line than the source select line includes two or more word lines.

10. The operating method of claim 1, wherein:
    each of the word line groups closer to the source select line than the drain select line includes a same number of the word lines, and
    each of the word line groups closer to the drain select line than the source select line includes a larger number of the word lines toward the drain select line.

11. The operating method of claim 1, wherein when a program operation is performed for memory cells included in a word line group closer to the source select line than the drain select line, from among the word line groups, a channel region of a program-inhibited cell is precharged to a preset level irrespective of the word line groups.

12. A semiconductor memory device, comprising:
    memory blocks each configured to include memory cells coupled to word lines classified into a plurality of word line groups between a drain select line and a source select line,
    where the memory cells include a program-inhibited cell comprising a channel region configured to be precharged based on input data, where the program-inhibited cell is from among memory cells coupled to a word line selected from among the word lines, and where a program operation is performed for storing the input data in the memory cells coupled to the selected word line, and
    where the precharge level of the channel region of the program-inhibited cell is changed depending on a position of a word line group including the selected word line between the drain select line and the source select line.

13. The semiconductor memory device of claim 12, wherein a program inhibition voltage is supplied to a bit line coupled to the program-inhibited cell and supplies a select voltage higher than a target precharge level of the channel region by a threshold voltage of a drain select transistor to the drain select line of the drain select transistor for transferring the program inhibition voltage to the program-inhibited cell so that the channel region is precharged.

14. The semiconductor memory device of claim 12, wherein when the channel region is precharged, channel regions of memory cells, from among memory cells included in an identical string with the program-inhibited cell, electrically coupled to a bit line are also precharged.

15. The semiconductor memory device of claim 12, the precharge level of the channel region is lowered as a word line group including the selected word line is closer to the drain select line.

16. The semiconductor memory device of claim 12, wherein each of the word line groups includes one word line.

17. The semiconductor memory device of claim 12, wherein a word line group closer to the drain select line, from among the word line groups, includes a larger number of the word lines.

18. The semiconductor memory device of claim 12, wherein:
    each of the word line groups closer to the source select line than the drain select line includes one word line, and
    each of the word line groups closer to the drain select line than the source select line includes two or more word lines.

19. The semiconductor memory device of claim 12, wherein:

each of the word line groups closer to the source select line than the drain select line includes a same number of the word lines, and each of the word line groups closer to the drain select line than the source select line includes a larger number of the word lines toward the drain select line.

20. The semiconductor memory device of claim 12, wherein a channel region of a program-inhibited cell is precharged to a preset level irrespective of the word line groups when performing a program operation for memory cells included in a word line group closer to the source select line than the drain select line, from among the word line groups.

* * * * *